United States Patent
Kamiya et al.

(10) Patent No.: US 10,775,831 B1
(45) Date of Patent: Sep. 15, 2020

(54) SEMICONDUCTOR DEVICE AND CONTROL METHOD OF SEMICONDUCTOR DEVICE

(71) Applicants: KABUSHIKI KAISHA TOSHIBA, Minato-ku, Tokyo (JP); TOSHIBA ELECTRONIC DEVICES & STORAGE CORPORATION, Minato-ku, Tokyo (JP)

(72) Inventors: Satoshi Kamiya, Kawasaki Kanagawa (JP); Tatsuya Tokue, Yokohama Kanagawa (JP)

(73) Assignees: KABUSHIKI KAISHA TOSHIBA, Tokyo (JP); TOSHIBA ELECTRONIC DEVICES & STORAGE CORPORATION, Tokyo (JP)

( * ) Notice: Subject to any disclaimer, the term of this patent is extended or adjusted under 35 U.S.C. 154(b) by 0 days.

(21) Appl. No.: 16/561,520

(22) Filed: Sep. 5, 2019

(30) Foreign Application Priority Data

Mar. 20, 2019 (JP) ................................. 2019-053650

(51) Int. Cl.
*G06F 1/04* (2006.01)
*H03K 3/037* (2006.01)
*H03K 5/135* (2006.01)
*G06F 1/12* (2006.01)
*H03K 19/21* (2006.01)
*H03K 19/20* (2006.01)
*H03L 7/18* (2006.01)
*H03K 5/00* (2006.01)

(52) U.S. Cl.
CPC ............... *G06F 1/04* (2013.01); *H03K 3/037* (2013.01); *H03K 5/135* (2013.01); *G06F 1/12* (2013.01); *H03K 19/20* (2013.01); *H03K 19/21* (2013.01); *H03K 2005/00019* (2013.01); *H03L 7/18* (2013.01)

(58) Field of Classification Search
None
See application file for complete search history.

(56) References Cited

U.S. PATENT DOCUMENTS

| 5,745,375 | A | * | 4/1998 | Reinhardt | G06F 1/206 700/286 |
|---|---|---|---|---|---|
| 8,018,271 | B2 | * | 9/2011 | Shimura | G06F 1/3203 327/544 |
| 9,823,301 | B2 | * | 11/2017 | Miro Panades | G01R 31/3016 |
| 2010/0153896 | A1 | * | 6/2010 | Sewall | G06F 30/3312 716/113 |

FOREIGN PATENT DOCUMENTS

JP 2011030066 A 2/2011

* cited by examiner

*Primary Examiner* — Jeffery S Zweizig
(74) *Attorney, Agent, or Firm* — Holtz, Holtz & Volek PC (57) ABSTRACT

A semiconductor device of an embodiment includes a path monitor circuit provided in a predetermined data path in a circuit that operates with a predetermined source clock, the path monitor circuit being configured to generate an output corresponding to a degree of a timing margin, a power supply voltage control circuit configured to set a power supply voltage that is used in the circuit based on an output of the path monitor circuit, and a clock generating circuit configured to supply to the circuit a clock obtained by dividing a frequency of the source clock, based on a detection result indicating that the power supply voltage obtained based on the output of the path monitor circuit becomes lower than a predetermined threshold.

12 Claims, 11 Drawing Sheets

SEMICONDUCTOR DEVICE AND CONTROL METHOD OF SEMICONDUCTOR DEVICE

CROSS-REFERENCE TO RELATED APPLICATION

This application is based upon and claims the benefit of priority from the prior Japanese Patent Application No. 2019-053650 filed in Japan on Mar. 20, 2019; the entire contents of which are incorporated herein by reference.

FIELD

Embodiments described herein relate generally to a semiconductor device, and a control method of the semiconductor device.

BACKGROUND

In response to the demand for reduction in power consumption of semiconductor devices, studies are being made on methods for controlling the power supply voltage. The power supply voltages of semiconductor devices influence the operation speeds of the semiconductor devices, so that the voltages are reduced while the characteristics of the transistors are taken into consideration. However, with miniaturization of the manufacturing process, the causes of variations in transistors increase, and the characteristics of the transistors fluctuate greatly.

Therefore, in consideration of manufacturing variations, temperature fluctuations and the like, a method called AVS (adaptive voltage scaling) is adopted which lowers a power supply voltage within a range where a target circuit operates normally to reduce power consumption. However, the method cannot cope with a case where abrupt reduction in power supply voltage occurs due to droop of a current or the like, and cannot reduce power consumption sufficiently.

DETAILED DESCRIPTION

Semiconductor devices of embodiments each include a path monitor circuit that is provided in a predetermined data path in a circuit that operates with a predetermined source clock, and that generates an output corresponding to a degree of a timing margin, a power supply voltage control circuit that sets a power supply voltage that is used in the circuit based on the output of the path monitor circuit, and a clock generating circuit that supplies to the circuit a clock obtained by dividing a frequency of the source clock, based on a detection result indicating that the power supply voltage becomes lower than a predetermined threshold.

Hereinafter, embodiments of the present invention will be described in detail with reference to the drawings.

First Embodiment

Figure 1:
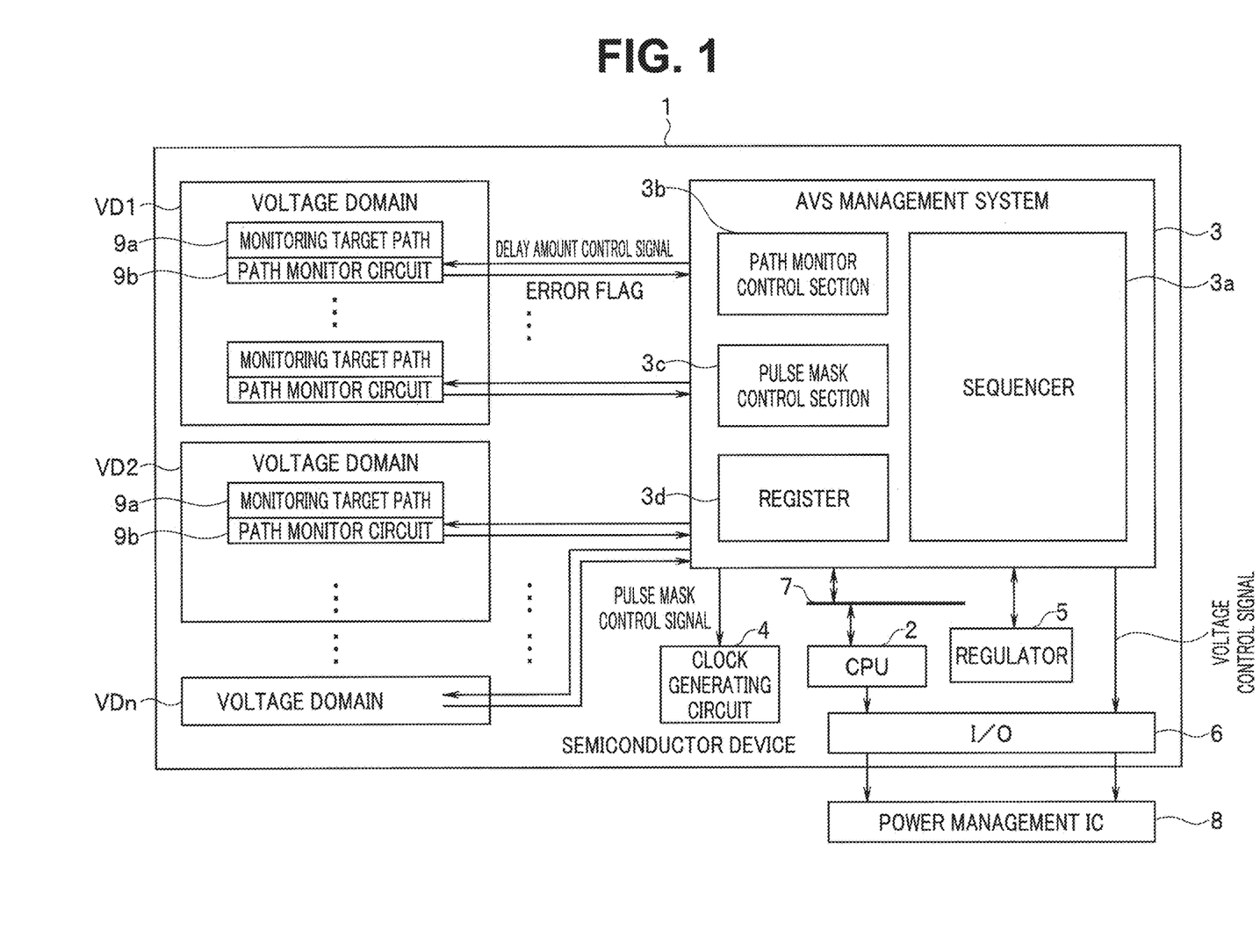
FIG. 1 is a block diagram illustrating a semiconductor device according to a first embodiment of the present invention.

FIG. 1 is a block diagram illustrating a semiconductor device according to a first embodiment of the present invention. The present embodiment enables sufficient reduction in power consumption while keeping a normal operation by determining a power supply voltage by obtaining a degree of the timing margin by using a canary flipflop (FP) with delay adjustment function, and avoiding an error operation by using a pulse mask type frequency divider.

(Problem of Conventional AVS)

In AVS, voltage control (AVS control) corresponding to a manufacturing variation of a semiconductor device is performed. In semiconductor devices, elements vary in chips, from chip to chip, and from wafer to wafer, and there exist transistors that operate at a higher speed than an expected speed (hereinafter, referred to as high-speed transistors), and transistors that operate at a lower speed than the expected speed (hereinafter, referred to as low-speed transistors), in addition to transistors that operate at the normal expected speed, when a certain specified power supply voltage is applied.

From a viewpoint of reduction in power consumption, a transistor is preferably driven with a low voltage. With respect to the high-speed transistor, an expected speed can be obtained even when the high-speed transistor is driven with a low voltage. In AVS, the power supply voltage is controlled taking the variation like this into consideration. Note that with respect to the low-speed transistor, an error operation is likely to be caused when the low-speed transistor is driven with a low voltage, so that control of reducing power consumption by reducing the power supply voltage cannot be performed.

In AVS, the degree of a timing margin is obtained by adopting a PSRO (performance screen ring oscillator) that expresses a characteristic of a chip such as a variation in circuit and a deterioration influence. Note that the degree of the timing margin shows a degree of a temporal margin between operation time periods of respective sections in the semiconductor device and restriction time periods that are set in advance by design. In AVS, by performing control of reducing the power supply voltage to a limit voltage that allows a normal operation by minimizing the degree of a margin of timing, an effect of sufficient reduction in power consumption is obtained. Note that in AVS, by temporarily changing the power supply voltage in response to the degree of the timing margin obtained by the PSRO, an error at a time of actual use is also avoided.

However, in measurement of the degree of the timing margin by the PSRO, a predetermined frequency measurement period is required. Therefore, when a sharp voltage fluctuation occurs due to a certain factor such as noise, there is a possibility that a timing error occurs before the degree of timing margin is measured and voltage control is performed. Accordingly, in AVS, in order to avoid a timing error reliably, it is necessary to add a voltage margin corresponding to a time period necessary to measure the degree of the timing margin at a time of control of the power supply voltage, and the power consumption cannot be reduced sufficiently.

(Configuration)

In FIG. 1, the semiconductor device 1 is provided with a plurality of voltage domains VD1, VD2, VDn (n is a natural number) (hereinafter, referred to as voltage domains VD when the voltage domains VD1, VD2, VDn do not have to be distinguished from one another). The voltage domain VD shows a domain in which elements are operated with the same power supply voltage, and in the voltage domain VD, a plurality of elements including a flipflop (hereinafter, referred to as FP) not illustrated are configured. A voltage that is supplied to the voltage domain VD is controlled by an AVS management system 3.

The semiconductor device 1 is provided with a CPU 2. The CPU 2 controls respective sections of the semiconductor device 1, and is connected to the AVS management system 3 via a bus 7. The AVS management system 3 is configured by a sequencer 3a, a path monitor control section 3b, a pulse mask control section 3c, and a register 3d, and has a bus slave interface installed in the AVS management system 3.

The sequencer 3a is configured by, for example, a programmable hardware sequencer, and executes a power control sequence. For example, the sequencer 3a may download a program from an external memory not illustrated and execute the power control sequence.

The path monitor control section 3b is controlled by the sequencer 3a, supplies a delay amount control signal to a path monitor circuit 9b in a monitoring target path 9a described later, and receives an error flag from the path monitor circuit 9b. The pulse mask control section 3c receives the error flag from the path monitor circuit 9b, and outputs to a clock generating circuit 4 a pulse mask control signal that is a frequency division control signal based on the received error flag. The register 3d stores set values by the path monitor control section 3b and the pulse mask control section 3c.

The sequencer 3a generates a voltage control signal in accordance with the power control sequence, and outputs the voltage control signal to a power management IC 8 via an I/O 6. As the I/O 6, a GPIO (general-purpose input/output), I2C (inter-integrated circuit), SPI (serial peripheral interface) and the like can be adopted.

The power management IC 8 is controlled by the CPU 2 via the I/O 6. The power management IC 8 is configured to be supplied with power from a battery or the like not illustrated, and generates a predetermined power supply voltage in accordance with the voltage control signal from the AVS management system 3. The power supply voltage is supplied to the semiconductor device 1. The semiconductor device 1 is provided with a regulator 5, and the regulator 5 is configured to be controlled by the AVS management system 3 to be able to generate a power supply voltage of a predetermined voltage based on the power supply voltage which is supplied from the power management IC 8. Note that as the regulator 5, an LDO (low dropout) regulator, a DC/DC converter and the like may be adopted.

The semiconductor device 1 is provided with the clock generating circuit 4. In the present embodiment, as the clock generating circuit 4, a pulse mask type frequency divider that will be described later is adopted. The clock generating circuit 4 is configured to generate clocks that are used in the respective sections including the respective voltage domains VD of the semiconductor device 1.

(Calculation of Degree of Timing Margin)

In the present embodiment, in order to reduce power consumption in a use state at a normal time (hereinafter, referred to as a normal use state) in which a sharp fluctuation in power supply voltage is not expected, a degree of the timing margin in the normal use state is obtained. First, timing check of whether or not a constraint condition is satisfied is performed in a plurality of data paths among respective FFs in the voltage domain VD by adopting a known STA (static timing analysis). The STA is to perform timing check in a design stage, and extracts a candidate of a worst path that is considered to have a lowest degree of the timing margin, in the present embodiment.

In the present embodiment, a data path that is extracted as the candidate of the worst path as a result of verification by the STA is set as the monitoring target path 9a, and the path monitor circuit 9b by a canary FF with delay adjustment function is provided in the monitoring target path 9a. Note that in extraction of the candidate of the worst path, a method other than the STA may be adopted.

Figure 2:
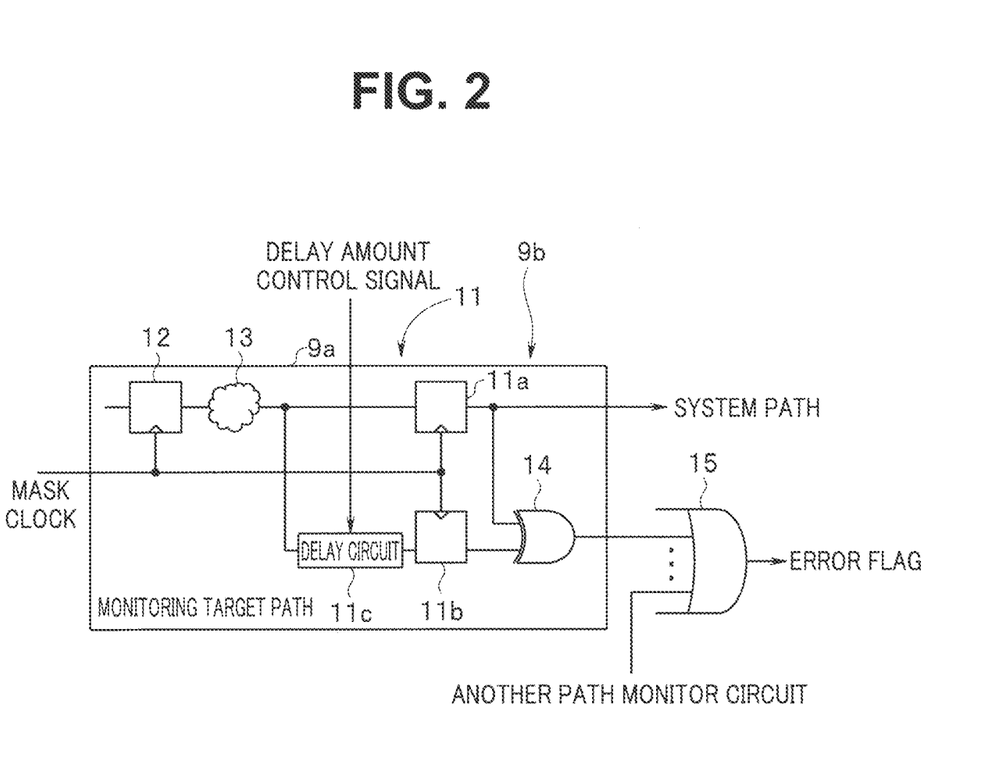
FIG. 2 is a circuit diagram illustrating one example of a specific configuration of a monitoring target path 9a and a path monitor circuit 9b in FIG. 1.

FIG. 2 is a circuit diagram illustrating an example of a specific configuration of the monitoring target path 9a and the path monitor circuit 9b in FIG. 1. The monitoring target path 9a includes a canary FF 11 with delay adjustment function and an EXOR circuit 14 that configure the path monitor circuit 9b, in addition to the FF 12 and a data path 13 not illustrated. Note that an OR circuit 15 is for outputting error flags described later from a plurality of path monitor circuits 9b together to the AVS management system 3, and is provided in the voltage domain VD as necessary. When respective path monitor circuits 9b output error flags directly to the AVS management system 3, the OR circuit 15 is not necessary.

The canary FF 11 with delay adjustment function is configured by FFs 11a and 11b and a delay circuit 11c. A common clock (a mask clock described later) is supplied to the FFs 12, 11a and 11b. The FFs 12, 11a and 11b take in and output inputs at clock timing. An output of the FF 12 is inputted to the FF 11a of the canary FF 11 with delay adjustment function via the data path 13, and is inputted to the FF 11b via the delay circuit 11c. An output of the FF 11a is supplied to a system path which is originally used. In other words, the ordinary system path is configured by the FF 12, the data path 13, and the FF 11a, and the delay circuit 11c and the FF 11b configure a replica path for detecting a timing error of the system path. The delay circuit 11c is configured to have a delay amount controlled by a delay amount control signal from the path monitor control section 3b of the AVS management system 3.

The EXOR circuit 14 obtains exclusive OR of the outputs of the FFs 11a and 11b and outputs the exclusive OR as an error flag. When a timing error does not occur in the FFs 11a and 11b, the outputs of the FFs 11a and 11b are the same logic. Accordingly, in this case, an output of the EXOR circuit 14 is "0". A signal which is inputted to the FF 11a is delayed by the delay circuit 11c, and is inputted to the FF 11b. As a result, a timing margin in the FF 11b becomes smaller by the delay amount, and under a situation where a timing error is likely to occur, a timing error always occurs in the FF 11b before a timing error occurs in the FF 11a. When a timing error occurs in only the FF 11b, logics of the outputs of the FFs 11a and 11b differ from each other, and the output of the EXOR circuit 14 is "1".

Note that even when a timing error occurs in the FF 11b, a timing error does not occur in the FF 11a which transmits original data, so that the timing error that occurs in the FF 11b will be referred to as a false timing error hereinafter.

In other words, the output of the EXOR circuit 14 (the output of the path monitor circuit 9b) becomes "1" before a timing error occurs in the FF 11a, due to occurrence of the false timing error. The output of the EXOR circuit 14 is supplied to the OR circuit 15. The outputs of the EXOR circuits 14 of the respective path monitor circuits 9b are given to the OR circuit 15. The OR circuit 15 outputs an error flag of "1", that is, an error flag indicating that the false timing error has occurred, when "1" is outputted from any one of the path monitor circuits 9b. In other words, the OR circuit 15 outputs the error flag indicating occurrence of the false timing error before a timing error is likely to occur in any one of the monitoring target paths 9a. The error flags from the path monitor circuits 9b of the respective voltage domains VD are supplied to the path monitor control section 3b and the pulse mask control section 3c directly or via the OR circuit 15.

Occurrence timing of the error flag of "1" indicating occurrence of the false timing error changes in accordance with the delay amount of the delay circuit 11c. When the delay amount of the delay circuit 11c is zero, a timing error also occurs in the FF 11a simultaneously with occurrence of the false timing error in the FF 11b. When the delay amount of the delay circuit 11c increases, timing at which the false timing error occurs becomes earlier by the delay amount than timing at which the timing error occurs in the FF 11a. Accordingly, the degree of the timing margin in the FF 11a can be obtained based on the delay amount of the delay circuit 11c in the path monitor circuit 9b that generates the error flag of "1".

When the path monitor circuits 9b by the canary FFs 11 with delay adjustment function are provided in all data paths of the semiconductor device 1, the degree of the timing margin can be obtained without performing extraction of the candidate of the worst path by the STA described above. However, since the canary FF 11 with delay adjustment function has the replica path installed in the canary FF 11, the number of FFs is doubled, and the size of the voltage domain VD increases.

Therefore, in the present embodiment, in order to suppress increase in area of the voltage domain VD, a plurality of candidates of the worst path that is considered to have a lowest degree of the timing margin is extracted by the STA, the candidates of the worst path are set as the monitoring target paths 9a, and the path monitor circuits 9b including the canary FFs 11 with delay adjustment function are installed in only the monitoring target paths 9a, as described above.

The candidates of the worst path extracted by the STA are obtained in the design stage, and are considered to be different from the worst path in an actual chip. Therefore, in the present embodiment, evaluation is performed while the power supply voltage is reduced after manufacture of chips, and it is determined whether or not a timing error occurs in paths other than the monitoring target paths 9a. When a timing error occurs in the paths other than the monitoring target path 9a, the path monitor control section 3b outputs a delay amount control signal, increases the delay amount of the delay circuit 11c of the canary FF 11 with delay adjustment function in the monitoring target path 9a, and always causes a false timing error firstly in the monitoring target path 9a.

In this way, it becomes possible to obtain the degree of the timing margin by regarding the monitoring target path 9a as the worst path equivalently by adjusting the delay amount of the delay circuit 11c by the path monitor control section 3b. The AVS management system 3 dynamically adjusts the delay amount of the delay circuit 11c by the path monitor control section 3b, makes setting so that the false timing error always occurs firstly in the monitoring target paths 9a, and thereafter reduces power supply voltages that are supplied to the respective voltage domains VD by a voltage control signal. The AVS management system 3 monitors occurrence of the false timing error while gradually reducing the power supply voltage, and obtains a voltage just before the false timing error occurs. The AVS management system 3 sets the voltage as a voltage that does not generate a timing error (hereinafter, referred to as an optimal power supply voltage), and can reduce power consumption most. Note that the optimal power supply voltage is described as a lowest voltage at which a false timing error does not occur, but the AVS management system 3 may set a predetermined margin taking uncertainty factors and voltage fluctuation into consideration, and determine the delay amount of the delay circuit. In other words, the optimal power supply voltage is set at a lowest voltage that can guarantee avoidance of a timing error in the normal use state.

The example of providing a plurality of monitoring target paths 9a in the respective voltage domains VD is shown in consideration of variations in the voltage domains VD, but only one monitoring target path 9a may be provided in the voltage domain VD. Note that voltage control (AVS control) by the AVS management system 3 is performed for each voltage domain VD, and the optimal power supply voltage is also set to each voltage domain VD.

(Avoidance of Timing Error)

As described above, the path monitor circuit 9b by the canary FF 11 with delay adjustment function is used to detect the degree of the timing margin and obtain the optimal power supply voltage. In the present embodiment, the path monitor circuit 9b is also used to avoid a timing error. The path monitor circuit 9b by the canary FF 11 with delay adjustment function can detect voltage reduction with which a timing error will occur at a higher speed by the false timing error before the timing error actually occurs. However, voltage control by the power management IC 8 and the regulator 5 requires a relatively long time period until the power supply voltage increases, and there is a possibility that the timing error occurs before the power supply voltage sufficiently increases.

Therefore, in the present embodiment, the clock generating circuit 4 is configured by a frequency divider, and when voltage reduction (hereinafter, also referred to as abnormal voltage reduction) that causes the false timing error to occur is detected, the error is avoided by reducing a clock frequency. In particular, when the clock generating circuit 4 is configured by the pulse mask type frequency divider, the clock frequency can be reduced from the next cycle after detection of the abnormal voltage reduction, and reliable avoidance of a timing error is possible. In other words, the pulse mask type frequency divider controls the clock generating circuit 4 to reduce the clock frequency when an error flag indicating a false timing error is generated from the path monitor circuit 9b in the normal use state with the optimal power supply voltage.

Figure 3:
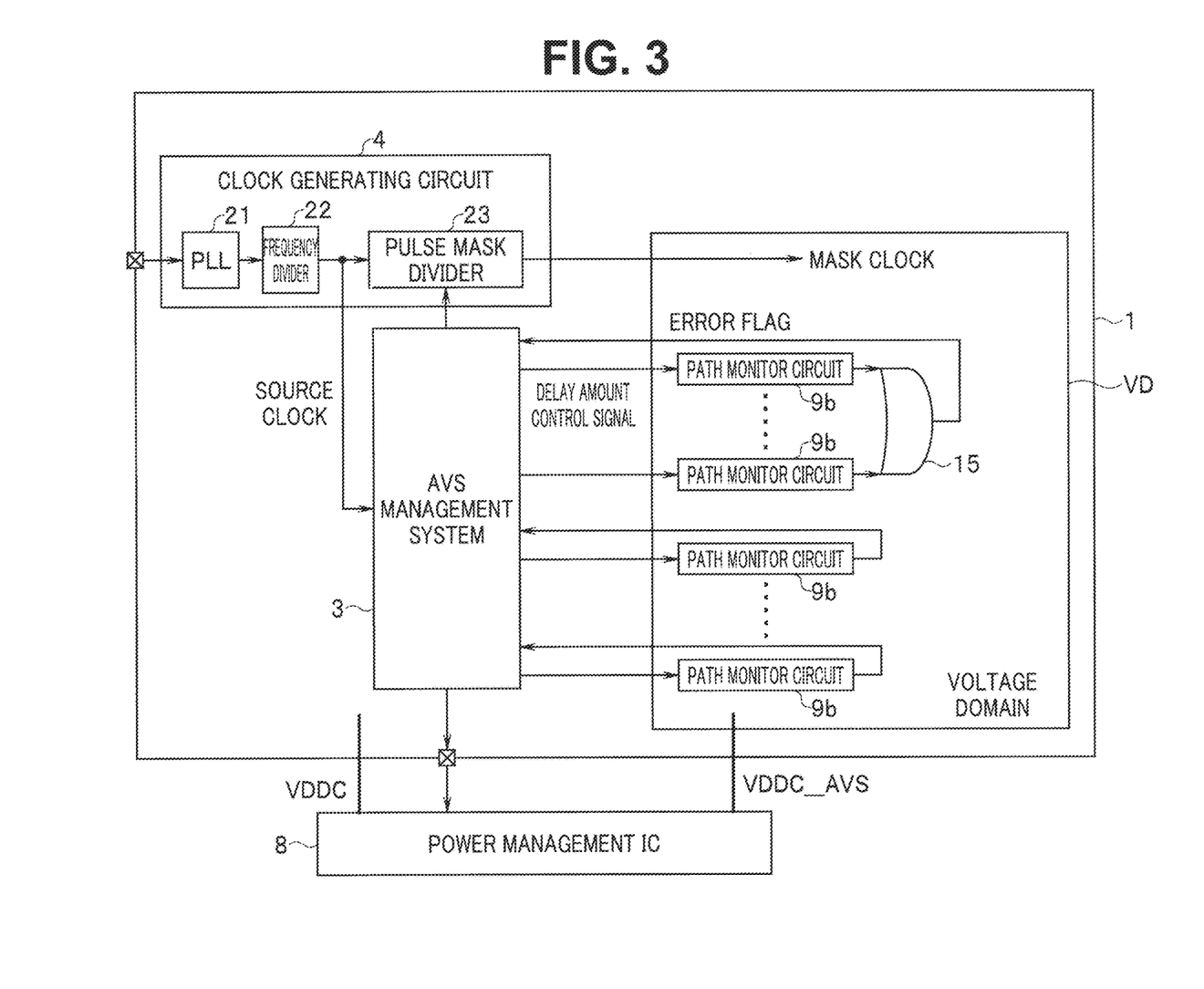
FIG. 3 is a block diagram illustrating a configuration example of a clock generating circuit 4 and a voltage domain VD by extracting a part of FIG. 1.

FIG. 3 is a block diagram illustrating a configuration example of the clock generating circuit 4 and the voltage domain VD by extracting a part of FIG. 1. An example in FIG. 3 illustrates only one voltage domain VD of a plurality of voltage domains VD, and the clock generating circuit 4 supplies a clock (mask clock) corresponding to the respective voltage domains VD to each voltage domain VD.

The AVS management system 3 gives a voltage control signal to the power management IC 8, and controls the voltage which is caused to be generated. The power management IC 8 generates a power supply voltage VDDC to give the power supply voltage VDDC to the semiconductor device 1. Further, the power management IC 8 generates power supply voltages VDDC_AVS which are set for the respective voltage domains VD based on the voltage control signal, and supplies the power supply voltages VDDC_AVS to the respective voltage domains VD.

In the example in FIG. 3, the clock generating circuit 4 which is the pulse mask type frequency divider is configured by a PLL 21, a frequency divider 22, and a pulse mask divider 23. The PLL 21 outputs to the frequency divider 22 a clock which is synchronized with an inputted clock. The frequency divider 22 divides a frequency of the output of the PLL 21 to output a source clock. The source clock is supplied to a pulse mask divider 23 and the AVS management system 3.

As described above, the AVS management system 3 controls the power management IC 8 to cause the power management IC 8 to generate an optimal power supply voltage as the power supply voltage VDDC_AVS, based on the degree of the timing margin which is detected by the path monitor circuit 9b. In the normal use state with the optimal power supply voltage, the path monitor circuit 9b monitors abnormal voltage reduction for avoidance of a timing error. In other words, when abnormal voltage reduction occurs, the path monitor circuit 9b outputs an error flag indicating occurrence of a false timing error, and supplies the error flag to the pulse mask control section 3c of the AVS management system 3 directly or via the OR circuit 15.

The pulse mask control section 3c as the clock control section supplies a pulse mask control signal to the pulse mask divider 23 to control occurrence of a clock. When abnormal voltage reduction occurs, the pulse mask divider 23 divides a frequency of the source clock by masking the source clock at predetermined periods based on the pulse mask control signal. Note that when a frequency division period is specified in advance, a pulse mask enable signal may be supplied to the pulse mask divider 23 as the pulse mask control signal. The pulse mask divider 23 generates a mask clock that is obtained by dividing the frequency of the source clock from the next cycle to a cycle in which the pulse mask control signal is inputted. Note that when a pulse mask is not instructed by the pulse mask control signal from the pulse mask control section 3c (when the pulse mask enable signal is nonactive), the mask clock is the same clock as the source clock.

Figure 4:
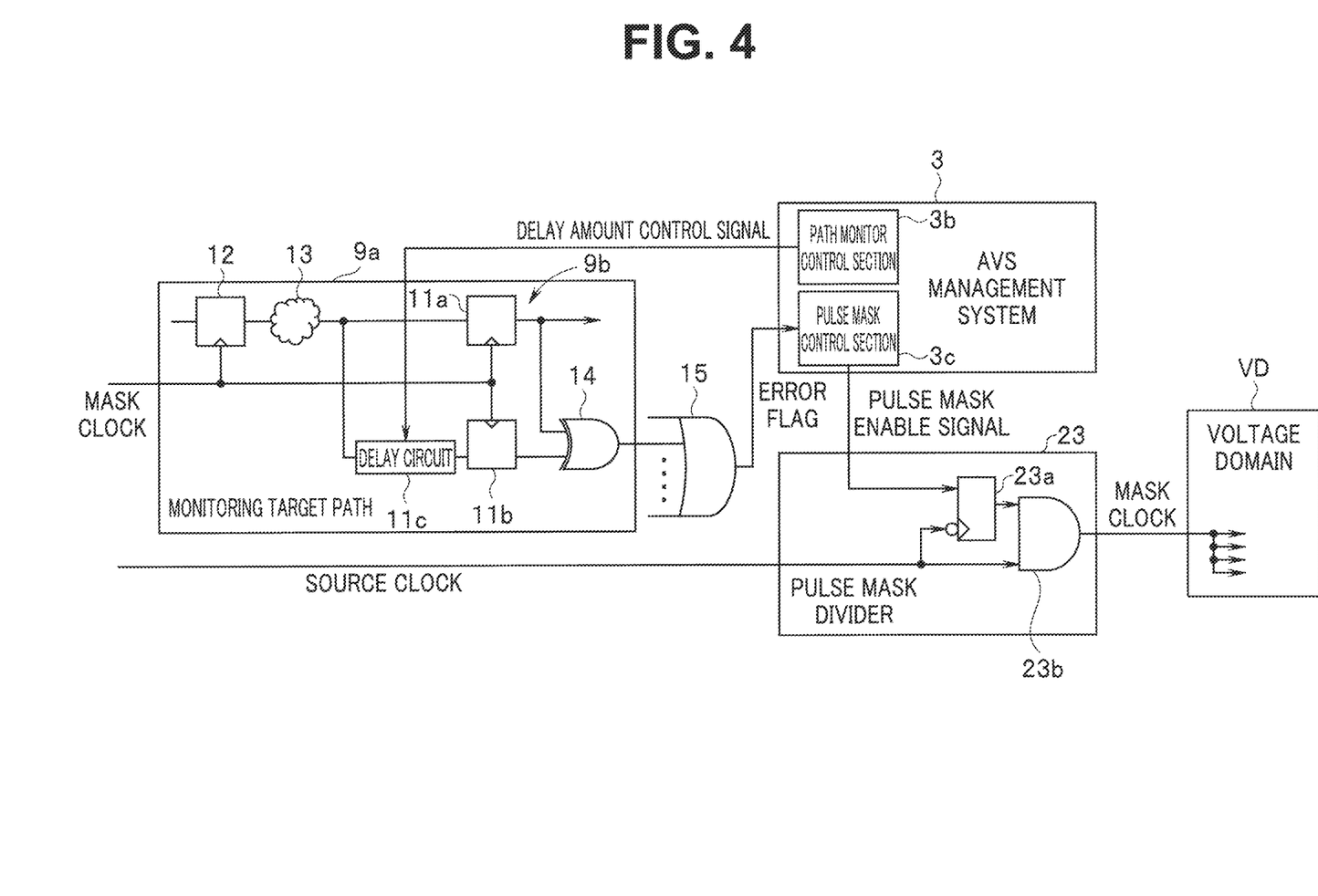
FIG. 4 is a block diagram illustrating a circuit configuration relating to avoidance of a timing error by extracting a part of FIG. 1.

FIG. 4 is a block diagram of a circuit configuration relating to avoidance of a timing error by extracting a part of FIG. 1.

The path monitor control section 3b gives a delay amount control signal to the delay circuit 11c, and determines a delay amount of the delay circuit 11c. As described above, the delay amount of the delay circuit 11c is set at a value at which the monitoring target path 9a is regarded as the worst path. In this state, the optimal power supply voltage that is a lowest power supply voltage that can avoid the timing error in the normal use state is set by the AVS management system 3.

When abnormal voltage reduction occurs in the normal use state at the optimal power supply voltage, the path monitor circuit 9b outputs an error flag indicating occurrence of a false timing error and supplies the error flag to the pulse mask control section 3c. When the error flag is inputted, the pulse mask control section 3c outputs the pulse mask enable signal (pulse mask control signal) to the pulse mask divider 23.

In an example in FIG. 4, the pulse mask divider 23 is configured by a latch circuit 23a and an AND circuit 23b. The latch circuit 23a latches a pulse mask enable signal at timing of the source clock and outputs the pulse mask enable signal to the AND circuit 23b. The AND circuit 23b is also given the source clock, and outputs the source clock in only a high level period of the pulse mask enable signal. In other words, the source clock is masked at predetermined periods by the pulse mask divider 23, and the frequency of the clock is divided. In other words, the pulse mask divider 23 starts frequency division by latching the pulse mask enable signal at one clock of the source clock, and can reduce a clock frequency in a short time period.

Note that the monitoring target path 9a in FIG. 4 is configured in the voltage domain VD in FIG. 4, and occurrence of a timing error is avoided by the mask clock.

Figure 5:
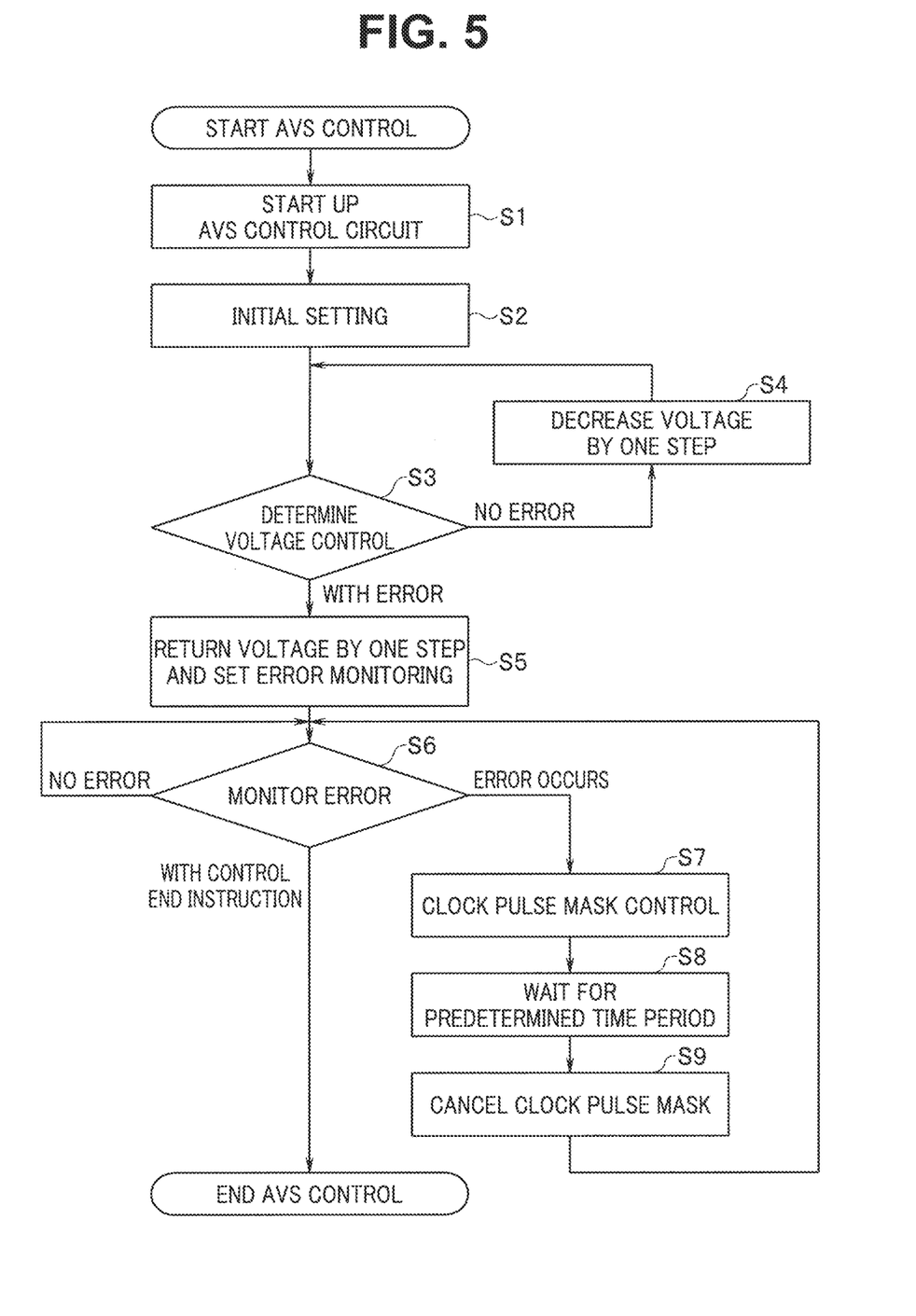
FIG. 5 is a flowchart for explaining an operation of the first embodiment.
Figure 6:
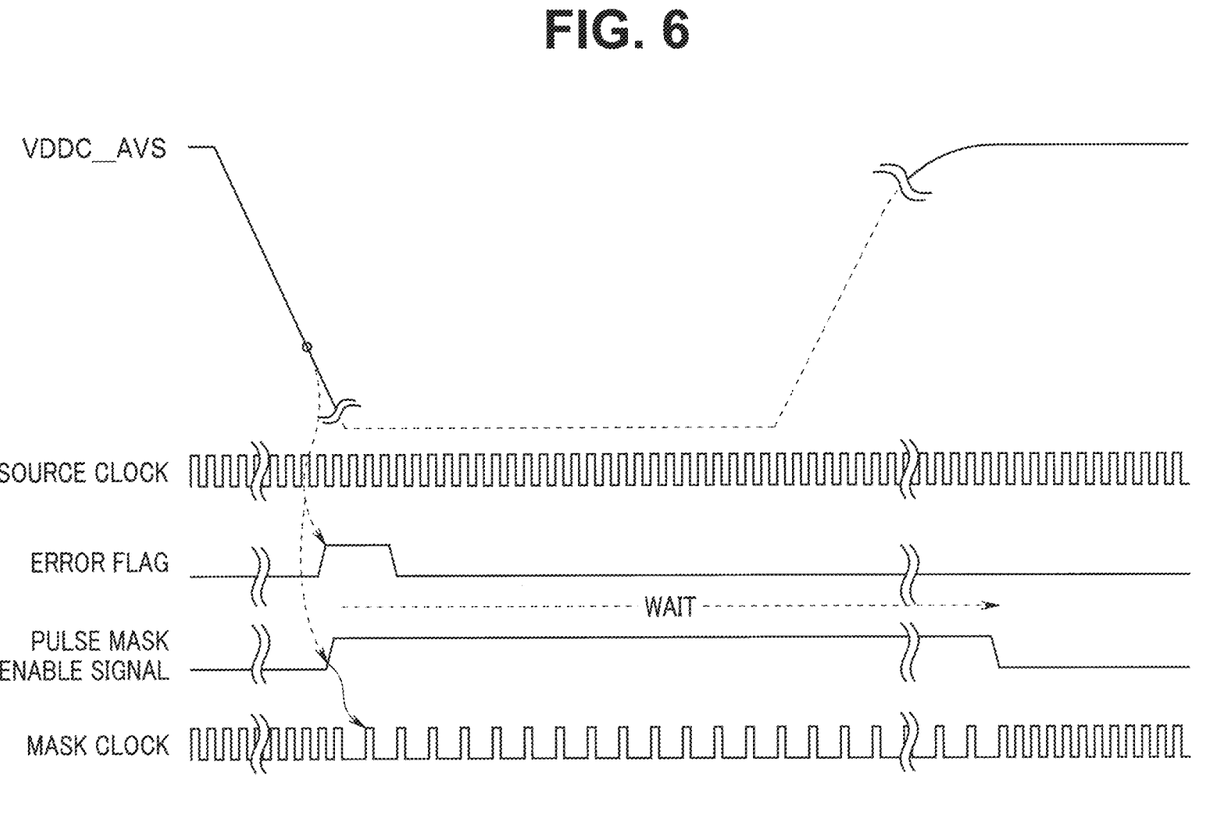
FIG. 6 is a timing chart for explaining the operation of the first embodiment.

Next, an operation of the embodiment configured in this way will be described with reference to FIGS. 5 and 6. FIG. 5 is a flowchart for explaining the operation of the embodiment, and FIG. 6 is a timing chart for explaining the operation of the embodiment. Note that an AVS control sequence in FIG. 5 is an example, and other control procedures may be adopted.

In the present embodiment, it is assumed that in a manufacturing stage of the semiconductor device 1, the candidate of the worst path extracted by the STA, for example, is set as the monitoring target path 9a, and the path monitor circuit 9b is configured in the monitoring target path 9a. The CPU 2 causes the AVS management system 3 to start AVS control in step S1 in FIG. 5. Thereby, the sequencer 3a of the AVS management system 3 starts an operation, and initial setting is performed (step S2).

In the initial setting, setting of the delay amount of the delay circuit 11c in the path monitor circuit 9b is performed. The path monitor control section 3b of the AVS management system 3 performs setting of the delay amount of the delay circuit 11c so that the false timing error occurs earliest in the path monitor circuit 9b out of timing errors that occur in the respective data paths in every voltage domain VD in the semiconductor device 1. Further, the AVS management system 3 performs setting for the number of pulse masks. Set values of the above are stored in the register 3d.

Next, the AVS management system 3 sets the optimal power supply voltage in steps S3 to S5. In other words, the AVS management system 3 generates a voltage control signal, and sets the power supply voltages VDDC_AVS that are supplied to the respective voltage domains VD at predetermined values by the power management IC 8. In this state, the path monitor control section 3b determines whether or not the error flag indicating occurrence of a false timing error occurs (step S3). Note that the determination is performed for each voltage domain VD.

When the error flag is not generated, the sequencer 3a controls the power supply voltage VDDC_AVS to reduce by one step in step S4. In this state, the path monitor control section 3b determines whether or not the error flag indicating occurrence of a false timing error occurs (step S3). Thereafter, the same operation is repeated, and the power supply voltage VDDC_AVS is reduced by one step at each time until the error flag is generated.

When the error flag indicating occurrence of the false timing error is generated, the sequencer 3a returns the power supply voltage VDDC_AVS to the state one step before where the false timing error does not occur, and sets the voltage as the optimal power supply voltage (step S5). The optimal power supply voltage is set for each voltage domain VD. Thereafter, the AVS management system 3 drives the respective voltage domains VD by the optimal power supply voltages in the normal use state.

By adopting the path monitor circuit 9b using the canary FF 11 with delay adjustment function and adjusting the delay amount, the degree of the timing margin for each voltage domain VD is obtained, and the optimal power supply voltage is set in response to the degree of the timing margin. By adjustment of the delay amount of the canary FF 11 with delay adjustment function, it is possible to set the power supply voltage at a lowest power supply voltage that can avoid the timing error in the normal use state, and it is possible to realize reduction in power consumption of the device.

There is a possibility that sharp voltage reduction occurs in the normal use state by the optimal power supply voltage. Therefore, in order to avoid the timing error in this case as well, occurrence of the false timing error from the path monitor circuit 9b using the canary FF 11 with delay adjustment function is monitored.

The AVS management system 3 performs error monitoring setting in step S5. Note that the AVS management system 3 may adjust the delay amount of the delay circuit 11c of the path monitor circuit 9b as necessary. The AVS management system 3 enables a pulse mask function of the pulse mask divider 23 that configures the clock generating circuit 4. The pulse mask control section 3c monitors the error flags from the respective path monitor circuits 9b in step S6.

Here, the power supply voltage VDDC_AVS that is the optimal power supply voltage is assumed to be sharply reduced for a certain reason. In FIG. 6, VDDC_AVS shows the state. A source clock in FIG. 6 shows a source clock that is outputted from the frequency divider 22 of the clock generating circuit 4, and in the normal use state, the pulse mask divider 23 does not perform a pulse mask operation, and the mask clock from the pulse mask divider 23 is the same clock as the source clock.

When the power supply voltage VDDC_AVS is reduced, operation speeds of the respective sections in the voltage domain VD are reduced, and the degree of the timing margin of FF is reduced. In this case, in the respective voltage domains VD, false timing errors occur firstly in the path monitor circuits 9b of the monitoring target paths 9a which are regarded as the worst path. A circle in FIG. 6 indicates the timing, and when the power supply voltage VDDC_AVS is reduced to a predetermined voltage value (the circle in FIG. 6), an error flag indicating occurrence of the false timing error is generated by any one of the path monitor circuits 9b in the voltage domain VD.

By doing so, the processing shifts to step S7 from step S6, and clock pulse mask control is performed. In other words, the pulse mask control section 3c generates a pulse mask enable signal at a high level by generation of the error flag as illustrated in FIG. 6. The pulse mask enable signal is supplied to the latch circuit 23a of the pulse mask divider 23 of the clock generating circuit 4, and as a result, the source clock is masked at input timing of the next source clock, and a mask clock in FIG. 6 is outputted from the AND circuit 23b.

The mask clock is supplied to the voltage domain VD to which the path monitor circuit 9b which generates the error flag belongs. As illustrated in FIG. 6, the mask clock has the frequency reduced as compared with the source clock, and in the voltage domain VD to which the mask clock is supplied, the degree of the timing margin increases, as a result of which, the timing error is avoided.

Note that in the example of FIG. 6, the pulse of the clock is masked once in two cycles. The mask pattern is not limited to this. Note that in general, when the clock period is doubled, the timing error does not occur, so that it is considered that avoidance of the timing error is possible by masking the clock pulse once in two cycles.

In this way, a false timing error is resolved in the path monitor circuit 9b, and the error flag changes to a low level that indicates that a false timing error does not occur. No timing error occurs in any of the FFs in the voltage domain VD. Note that a false timing error does not occur, either.

The pulse mask control section 3c waits for a predetermined time period until the power supply voltage returns to the optimal power supply voltage in step S8, and thereafter, makes the pulse mask enable signal nonactive as illustrated in FIG. 6 (step S9). As a result, the mask clock returns to the same clock as the source clock. The AVS management system 3 returns the processing to step S6 from step S9 and continues monitoring the error flag. Note that when the power supply voltage is still lower than the voltage value of the circle in FIG. 6 at this point of time, a false timing error occurs again, so that the processing of steps S7 to S9 is repeated, and occurrence of the timing error is avoided.

A timing error is avoided by the masking of the clock pulse, but setting of the optimal power supply voltage is not changed, so that the operation can be returned immediately to the operation in the normal use state by the optimal power supply voltage by the power supply voltage returning to the optimal power supply voltage. Accordingly, as compared with control that avoids an error operation by adding a predetermined margin to the power supply voltage as in the prior art, an operation for a long time period can be performed with a sufficiently low voltage, and an effect of larger reduction in power consumption can be obtained.

When the AVS management system 3 receives an end instruction of the AVS control from the CPU 2, the AVS management system 3 ends the processing.

In this way, in the present embodiment, the path monitor using the canary FF with delay adjustment function is adopted to measure the degree of the timing margin. In response to the obtained timing margin, the optimal power supply voltage that can sufficiently reduce the power consumption while avoiding an error is determined. Thereby, sufficient reduction in power consumption is possible. Further, abnormal voltage reduction by which a timing error is likely to occur is detected by using the canary FF with delay adjustment function, and abnormal voltage reduction is detectable before occurrence of a timing error. When abnormal voltage reduction is detected, occurrence of a timing error is prevented by dividing the frequency of the clock, and occurrence of a timing error can be reliably inhibited before the timing error occurs due to the abnormal voltage reduction. Accordingly, it is not necessary to add a margin to the optimal power supply voltage in order to avoid a timing error, setting of a sufficiently low optimal power supply voltage is possible, and sufficient reduction in power consumption is possible.

Second Embodiment

Figure 7:
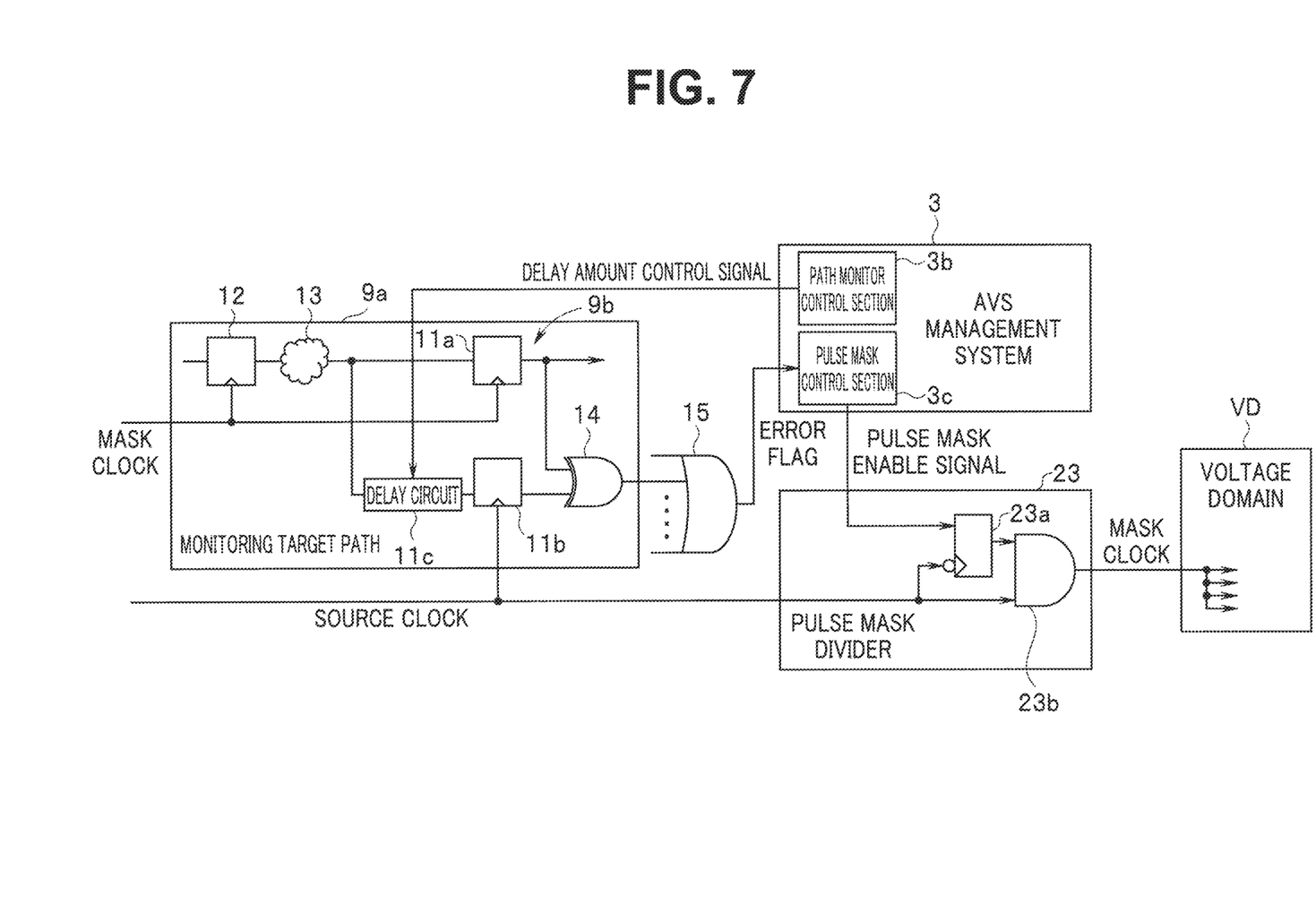
FIG. 7 is a block diagram illustrating a second embodiment of the present invention.

FIG. 7 is a block diagram illustrating a second embodiment of the present invention. In FIG. 7, the same components as the components in FIG. 4 are assigned with the identical reference signs, and explanation will be omitted. In the first embodiment, the period (pulse mask period) in which the source clock is masked to generate the mask clock is the predetermined time period in step S8 in FIG. 5. Consequently, depending on setting of the pulse mask period, abnormal voltage reduction sometimes occurs even after the end of the pulse mask period, or sometimes the pulse mask period does not end even after the power supply voltage returns to the optimal power supply voltage. Therefore, the present embodiment is to end the pulse mask period by abnormal voltage reduction being resolved, and the power supply voltage returning to the optimal power supply voltage.

The present embodiment differs from the first embodiment only in that instead of a mask clock, a source clock is given to the FF 11b configuring the canary FF 11 with delay adjustment function in the path monitor circuit 9b, as illustrated in FIG. 7. The FF 11b takes in an output of the delay circuit 11c at timing of the source clock, and outputs the output of the delay circuit 11c to the EXOR circuit 14.

Figure 8:
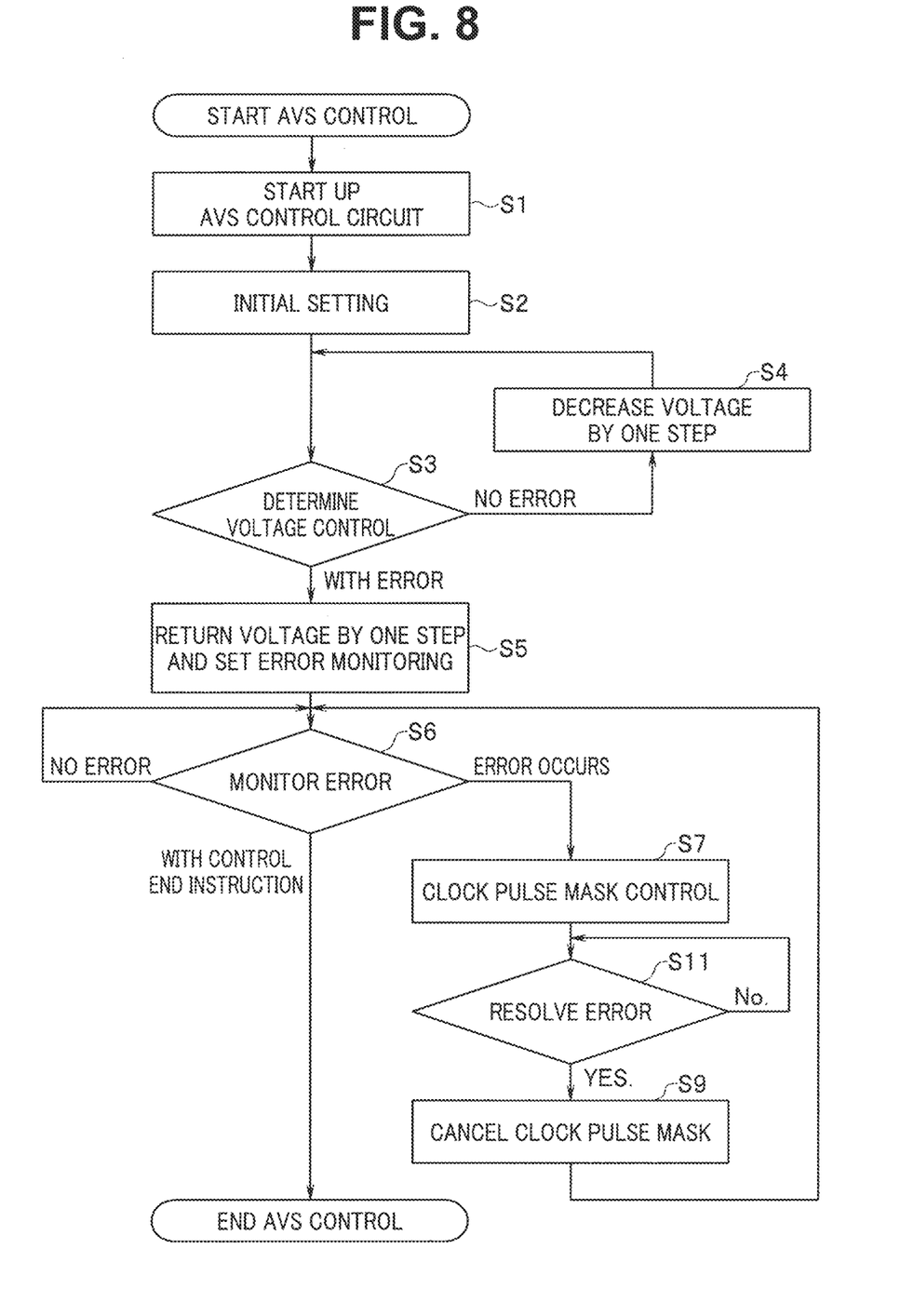
FIG. 8 is a flowchart for explaining an operation of a second embodiment.
Figure 9:
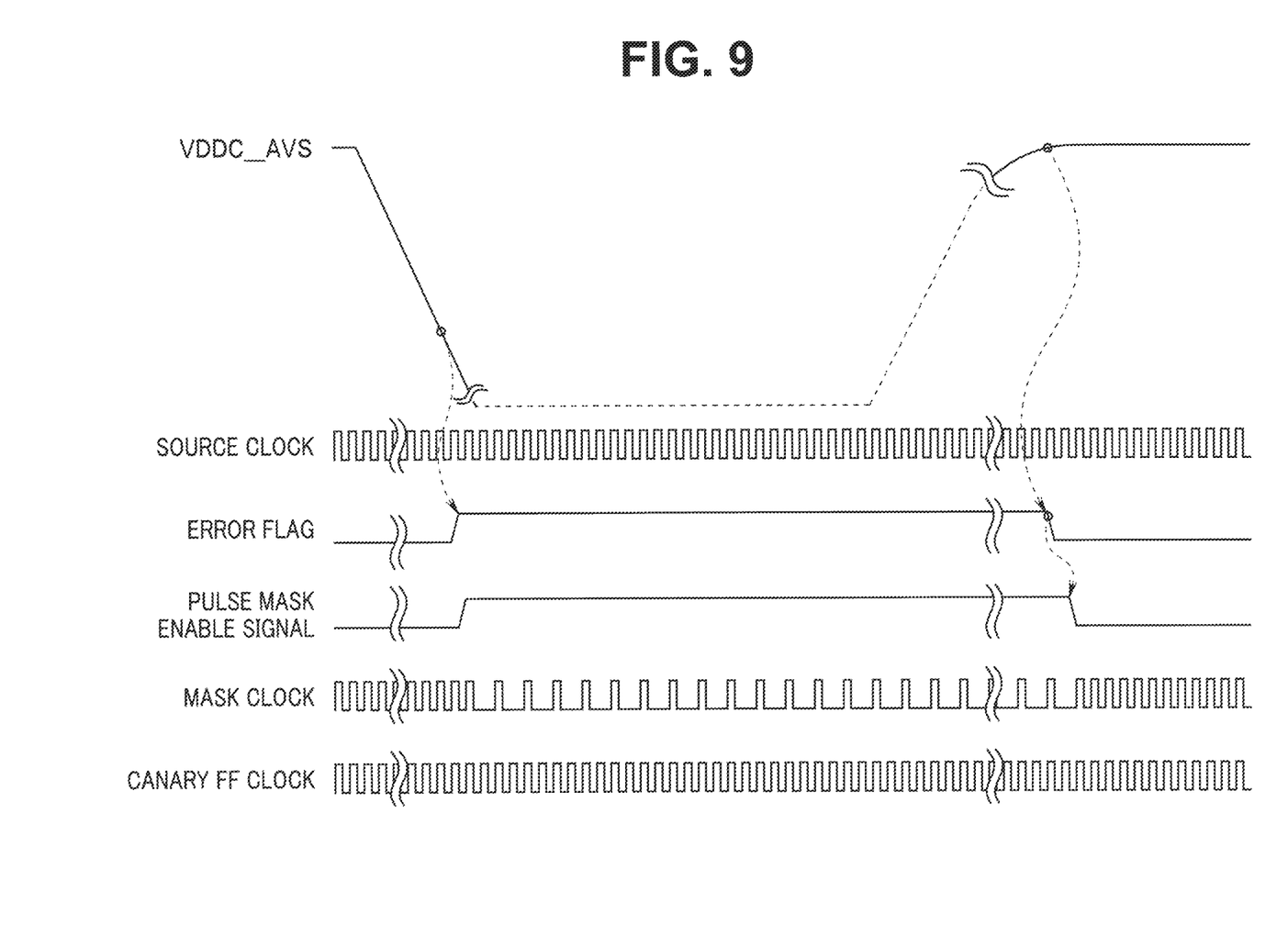
FIG. 9 is a timing chart for explaining the operation of the second embodiment.

Next, an operation of the embodiment which is configured in this way will be described with reference to FIGS. 8 and 9. FIG. 8 is a flowchart for explaining the operation of the embodiment, and FIG. 9 is a timing chart for explaining the operation. Note that the AV control sequence in FIG. 8 is an example, and other control procedures may be adopted.

As illustrated in FIG. 8, procedures of steps S1 to S7 are the same as the procedures of the first embodiment in FIG. 5. In other words, when the power supply voltage VDDC_AVS which is the optimal power supply voltage is sharply reduced for a certain reason, a false timing error occurs firstly in the path monitor circuit 9b of the monitoring target path 9a which is regarded as the worst path. A circle in FIG. 9 indicates timing of the occurrence of the false timing error, and when the power supply voltage VDDC_AVS is reduced to a predetermined voltage value (circle in FIG. 9), an error flag indicating occurrence of the false timing error is generated by any one of the path monitor circuits 9b in the voltage domain VD. Thereby, clock pulse mask control is performed in step S7, and the pulse mask control section 3c generates a pulse mask enable signal of a high level. In this way, the mask clock in FIG. 9 is outputted from the pulse mask divider 23, and is supplied to the voltage domain VD to which the path monitor circuit 9b which generates the error flag belongs.

In the present embodiment, the FF 11b which configures the canary FF 11 with delay adjustment function operates with the source clock instead of the mask clock. Accordingly, in the FF 11b, the false timing error state continues until abnormal voltage reduction ends and the power supply voltage returns to the optimal power supply voltage which is higher than the circle in FIG. 9. Accordingly, even after the mask clock obtained by dividing the frequency of the source clock is generated, the error flag indicating occurrence of the false timing error continues to be outputted.

The path monitor control section 3b determines whether or not the error is resolved in step S11, and after the false timing error is resolved, the path monitor control section 3b makes the pulse mask enable signal nonactive (step S9). Note that since the mask clock obtained by dividing the frequency of the source clock is supplied to the other elements than the FF 11b which configures the canary FF 11 with delay adjustment function, a timing error does not occur in the voltage domain VD.

When the power supply voltage which is supplied to the voltage domain VD returns to the optimal power supply voltage in the normal use state, the false timing error is resolved, and the mask clock becomes the same as the original source clock.

In this way, in the present embodiment, the same effect as the effect of the first embodiment can be obtained. Further, the source clock is supplied to the FF for false timing error detection which configures the canary FF with delay adjustment function, and after resolution of the false timing error is confirmed, control of returning to the source clock becomes possible.

Third Embodiment

Figure 10:
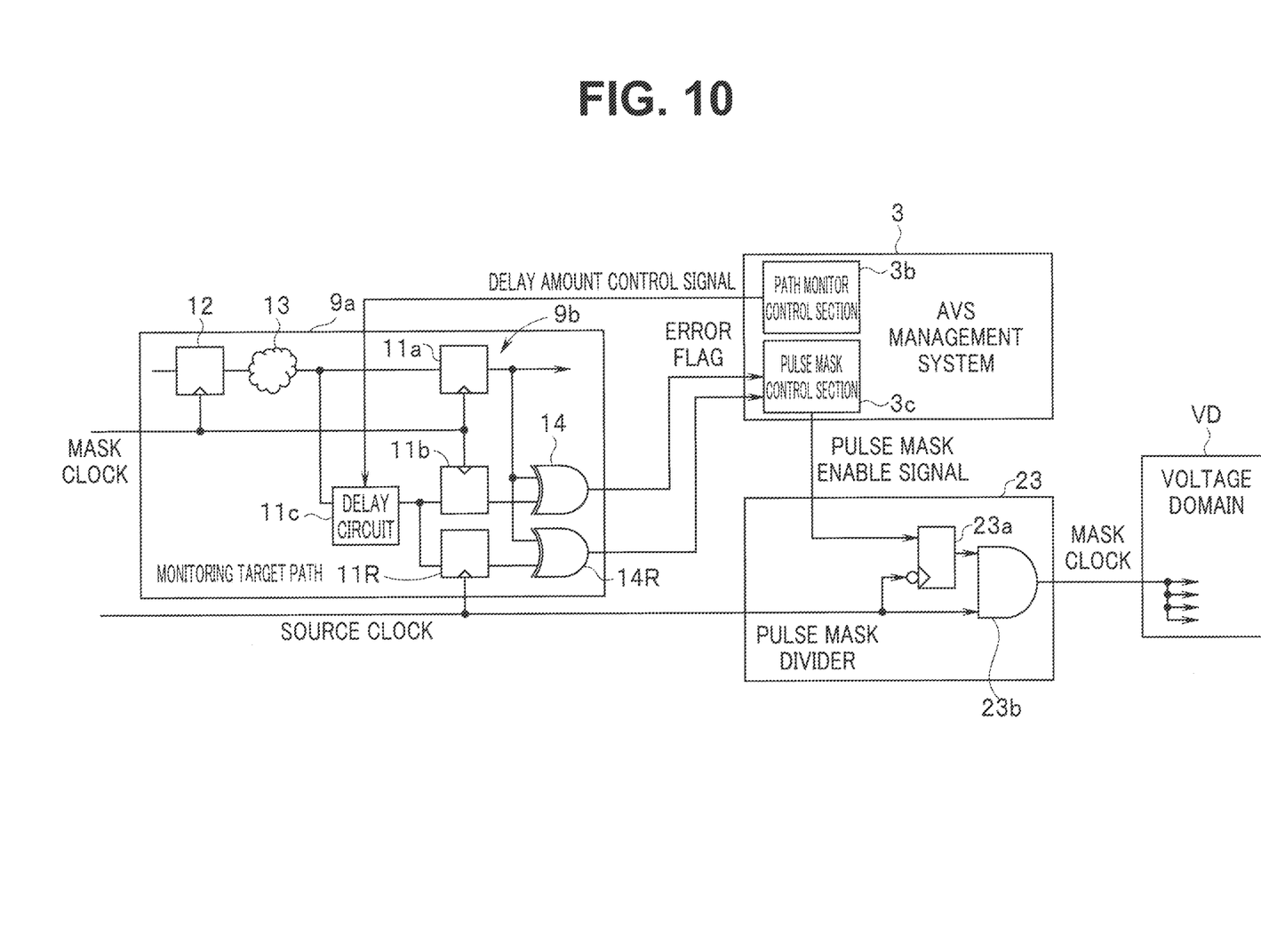
FIG. 10 is a block diagram illustrating a third embodiment of the present invention.

FIG. 10 is a block diagram illustrating a third embodiment of the present invention. In FIG. 10, the same components as the components in FIG. 4 are assigned with identical reference signs and explanation will be omitted. The present embodiment is to end the pulse mask period after abnormal voltage reduction is resolved, and the power supply voltage returns to an optimal power supply voltage, similarly to the second embodiment.

The present embodiment differs from the first embodiment only in that an error resolution confirmation canary FF 11R and an EXOR circuit 14R are added as illustrated in FIG. 10. A source clock is given to the FF 11R, and the FF 11R takes in an output of the delay circuit 11c at timing of the source clock and outputs the output of the delay circuit 11c to the EXOR circuit 14R. The EXOR circuit 14R is configured to obtain exclusive OR of the outputs of the FFs 11a and 11R, and generate a resolution flag indicating whether or not an error is resolved to output the resolution flag to the pulse mask control section 3c.

In the present embodiment, the pulse mask control section 3c causes a pulse mask period to end by the resolution flag.

Figure 11:
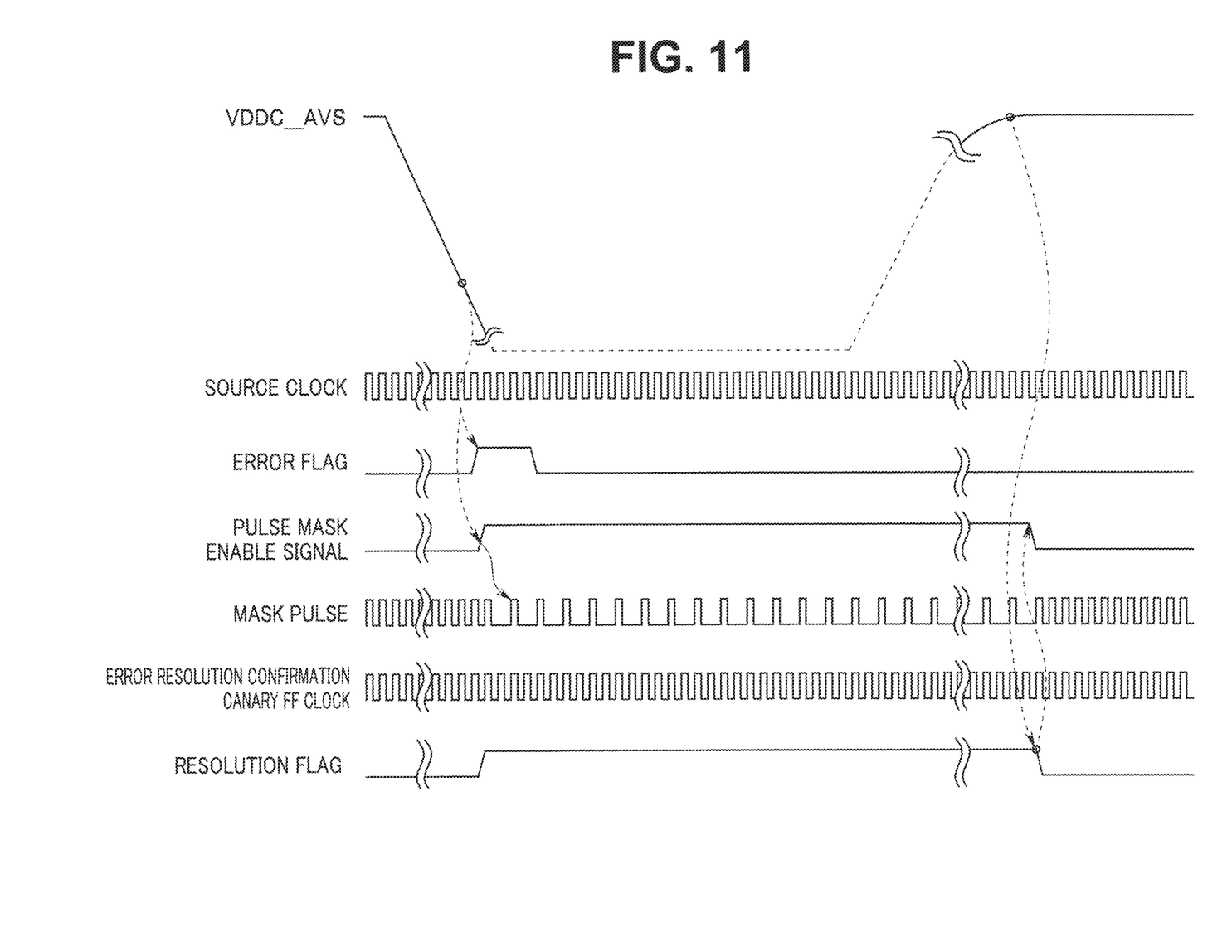
FIG. 11 is a timing chart for explaining an operation of the third embodiment.

Next, an operation of the embodiment which is configured in this way will be described with reference to FIG. 11. FIG. 11 is a timing chart for explaining the operation. In the present embodiment, the flowchart in FIG. 8 is also executed.

In other words, the present embodiment differs from the second embodiment only in procedures of returning from an error. The mask clock is supplied to the FF 11b which configures the canary FF 11 with delay adjustment function, and as illustrated in FIG. 11, the mask clock obtained by dividing the frequency of the source clock is generated, whereby the false timing error is resolved. On the other hand, the error resolution confirmation canary FF 11R is supplied with the source clock. Accordingly, even when the mask clock obtained by dividing the frequency of the source clock is generated, a false timing error occurs in the FF 11R in the period in which abnormal voltage reduction occurs, and the resolution flag from the EXOR circuit 14R is at a high level which indicates that the false timing error occurs, as illustrated in FIG. 11.

The resolution flag from the EXOR circuit 14R remains at the high level which indicates occurrence of the false timing error as illustrated in FIG. 11 until the abnormal voltage reduction ends and the power supply voltage returns to an optimal power supply voltage that is higher than the circle in FIG. 11. Consequently, the pulse mask period is continued until the power supply voltages which are supplied to the respective voltage domains VD return to the optimal power supply voltages in the normal use state, and no timing error occurs in any of the FFs in the voltage domain VD.

When the power supply voltage returns to the optimal power supply voltage in the normal use state, the false timing error in the FF 11R is resolved, and the resolution flag drops to a low level. Thereby, the pulse mask control section 3c ends the pulse mask period, and returns the mask clock to the same clock as the source clock.

In this way, in the present embodiment, the same effect as the effect of the second embodiment can also be obtained.

While certain embodiments have been described, these embodiments have been presented by way of example only, and are not intended to limit the scope of the inventions. Indeed, the novel devices and methods described herein may be embodied in a variety of other forms; furthermore, various omissions, substitutions and changes in the form of the embodiments described herein may be made without departing from the spirit of the inventions. The accompanying claims and their equivalents are intended to cover such forms or modification as would fall within the scope and spirit of the inventions.

What is claimed is:

1. A semiconductor device comprising:
   a path monitor circuit provided in a data path in a circuit that operates with a source clock, the path monitor circuit being configured to generate an output corresponding to a degree of a timing margin;
   a power supply voltage control circuit configured to set a power supply voltage that is used in the circuit based on the output of the path monitor circuit; and
   a clock generating circuit configured to supply to the circuit a clock obtained by dividing a frequency of the source clock, based on a detection result indicating that the power supply voltage becomes lower than a predetermined threshold,
   wherein the path monitor circuit includes a canary flipflop, and
   wherein the canary flipflop has an adjustment function of a delay amount.

2. The semiconductor device according to claim 1, further comprising:
   a clock control section configured to cause the clock generation circuit to divide the frequency of the source clock when the clock control section obtains the detection result indicating that the power supply voltage becomes lower than the predetermined threshold, based on a false timing error that occurs in the canary flipflop.

3. The semiconductor device according to claim 1, further comprising:
   a path monitor control section configured to make the path monitor circuit equivalent to being provided in a worst path with a lowest degree of the timing margin, by adjusting the canary flipflop delay amount.

4. The semiconductor device according to claim 3, wherein the power supply voltage control circuit sets the power supply voltage based on an output voltage at a time of a false timing error occurring in the canary flipflop.

5. The semiconductor device according to claim 2, wherein the clock control section cancels frequency division control of the source clock a predetermined time period after the clock control section performs control of causing the clock generating circuit to divide the frequency of the source clock.

6. The semiconductor device according to claim 2, wherein:
   a canary flipflop for error cancellation configured to operate with the source clock is further provided in the path monitor circuit, and
   the clock control section cancels frequency division control of the source clock after a false timing error that occurs in the canary flipflop for error cancellation is resolved, after the clock control section performs control of the frequency of the source clock.

7. A semiconductor device according to claim 2, comprising:
   a path monitor circuit provided in a data path in a circuit that operates with a source clock, the path monitor circuit being configured to generate an output corresponding to a degree of a timing margin;
   a power supply voltage control circuit configured to set a power supply voltage that is used in the circuit based on the output of the path monitor circuit; and
   a clock generating circuit configured to supply to the circuit a clock obtained by dividing a frequency of the source clock, based on a detection result indicating that the power supply voltage becomes lower than a predetermined threshold,
   wherein the path monitor circuit includes a canary flipflop, and
   wherein the clock generating circuit is configured by a pulse mask type frequency divider.

8. The semiconductor device according to claim 7, further comprising:
   a clock control section configured to enable the clock generating circuit to perform pulse mask control of the source clock, when the clock control section obtains the detection result indicating that the power supply voltage becomes lower than the predetermined threshold, based on a false timing error that occurs in the canary flipflop.

9. The semiconductor device according to claim 8, wherein the pulse mask type frequency divider performs pulse masking of the source clock in a next cycle to a cycle in which an instruction of the pulse mask control is generated.

10. A semiconductor device comprising:
    a path monitor circuit provided in a data path in a circuit that operates with a source clock, the path monitor circuit being configured to generate an output corresponding to a degree of a timing margin, and the path monitor circuit including a canary flipflop;
    a power supply voltage control circuit configured to set a power supply voltage that is used in the circuit based on the output of the path monitor circuit;
    a clock generating circuit configured to supply to the circuit a clock obtained by dividing a frequency of the source clock, based on a detection result indicating that the power supply voltage becomes lower than a predetermined threshold; and
    a clock control section configured to cause the clock generation circuit to divide the frequency of the source clock when the clock control section obtains the detection result indicating that the power supply voltage becomes lower than the predetermined threshold, based on a false timing error that occurs in the canary flipflop,
    wherein the canary flipflop is caused to operate by using the source clock, and
    wherein the clock control section cancels frequency division control of the source clock after the false timing error, after the clock control section performs control of the frequency of the source clock.

11. The semiconductor device according to claim 10, wherein the clock control section cancels frequency division control of the source clock a predetermined time period after the clock control section performs control of causing the clock generating circuit to divide the frequency of the source clock.

12. The semiconductor device according to claim 10, wherein:
   a canary flipflop for error cancellation configured to operate with the source clock is further provided in the path monitor circuit, and
   the clock control section cancels frequency division control of the source clock after a false timing error that occurs in the canary flipflop for error cancellation is resolved, after the clock control section performs control of the frequency of the source clock.

* * * * *